(12) United States Patent
Mulder et al.

(10) Patent No.: US 8,937,706 B2
(45) Date of Patent: Jan. 20, 2015

(54) LITHOGRAPHIC APPARATUS AND METHOD

(75) Inventors: Heine Melle Mulder, Veldhoven (NL); Johannes Jacobus Matheus Baselmans, Oirschot (NL); Adrianus Franciscus Petrus Engelen, Waalre (NL); Markus Franciscus Antonius Eurlings, Tilburg (NL); Hendrikus Robertus Marie Van Greevenbroek, Eindhoven (NL); Paul Van Der Veen, Waalre (NL)

(73) Assignee: ASML Netherlands B.V., Veldhoven (NL)

( * ) Notice: Subject to any disclaimer, the term of this patent is extended or adjusted under 35 U.S.C. 154(b) by 2397 days.

(21) Appl. No.: 11/729,960

(22) Filed: Mar. 30, 2007

(65) Prior Publication Data

US 2008/0239268 A1    Oct. 2, 2008

(51) Int. Cl.
*G03B 27/42*         (2006.01)
*G03F 7/20*          (2006.01)

(52) U.S. Cl.
CPC ........ *G03F 7/70291* (2013.01); *G03F 7/70116* (2013.01); *G03F 7/702* (2013.01); *G03F 7/70516* (2013.01)
USPC .................... 355/53; 355/67; 355/77; 355/63

(58) Field of Classification Search
CPC . G03F 7/702; G03F 7/70116; G03F 7/70075; G03F 7/70191; G03F 7/70216; G03F 7/70308; G03F 7/70066; G03F 7/70108; G03F 1/24; G03F 7/70058; G03F 7/70141; G03F 7/70158; G03F 7/70558
USPC ......... 355/30, 53, 67; 359/223–225, 849–850
See application file for complete search history.

(56) References Cited

U.S. PATENT DOCUMENTS

| 6,031,946 A | 2/2000 | Bergmann et al. ............... 385/18 |
| 6,737,662 B2 | 5/2004 | Mulder et al. ................ 250/548 |

(Continued)

FOREIGN PATENT DOCUMENTS

| CN | 1879062 | 12/2006 |
| DE | 103 43 333 A1 | 4/2005 |

(Continued)

OTHER PUBLICATIONS

European Search Report for European Application No. 08 25 0946 dated Aug. 6, 2008.

(Continued)

*Primary Examiner* — Mesfin T Asfaw
(74) *Attorney, Agent, or Firm* — Pillsbury Winthrop Shaw Pittman LLP

(57) ABSTRACT

A device manufacturing method includes conditioning a beam of radiation using an illumination system. The conditioning includes controlling an array of individually controllable elements and associated optical components of the illumination system to convert the radiation beam into a desired illumination mode, the controlling including allocating different individually controllable elements to different parts of the illumination mode in accordance with an allocation scheme, the allocation scheme selected to provide a desired modification of one or more properties of the illumination mode, the radiation beam or both. The method also includes patterning the radiation beam with a pattern in its cross-section to form a patterned beam of radiation, and projecting the patterned radiation beam onto a target portion of a substrate.

24 Claims, 9 Drawing Sheets

(56) References Cited

U.S. PATENT DOCUMENTS

| | | | |
|---|---|---|---|
| 2003/0030780 A1* | 2/2003 | Dieckmann et al. | 355/67 |
| 2003/0038225 A1* | 2/2003 | Mulder et al. | 250/205 |
| 2003/0043876 A1* | 3/2003 | Lublin et al. | 372/55 |
| 2005/0237508 A1 | 10/2005 | Eib et al. | |
| 2006/0175556 A1 | 8/2006 | Yabuki | |
| 2006/0187517 A1 | 8/2006 | Ljungblad | |
| 2007/0013890 A1 | 1/2007 | Loopstra et al. | 355/69 |
| 2007/0041004 A1 | 2/2007 | Suzuki | |
| 2007/0165202 A1* | 7/2007 | Koehler et al. | 355/67 |

FOREIGN PATENT DOCUMENTS

| | | |
|---|---|---|
| DE | 10 2004 019 346 A1 | 11/2005 |
| EP | 1 174 769 B1 | 1/2002 |
| JP | 11-003849 | 1/1999 |
| JP | 2003-022967 | 1/2003 |
| JP | 2007-505488 | 3/2007 |
| TW | 200625027 | 7/2006 |
| WO | WO 03/093902 A2 | 11/2003 |
| WO | WO 2005/026843 A2 | 3/2005 |

OTHER PUBLICATIONS

Japanese Office Action mailed Oct. 26, 2010 in corresponding Japanese patent application No. 2008-072785.

European Search Report dated Apr. 29, 2011 in corresponding European Patent Application No. 11156407.

Taiwan Office Action dated Feb. 27, 2013 in corresponding Taiwan Patent Application No. 097109495.

* cited by examiner

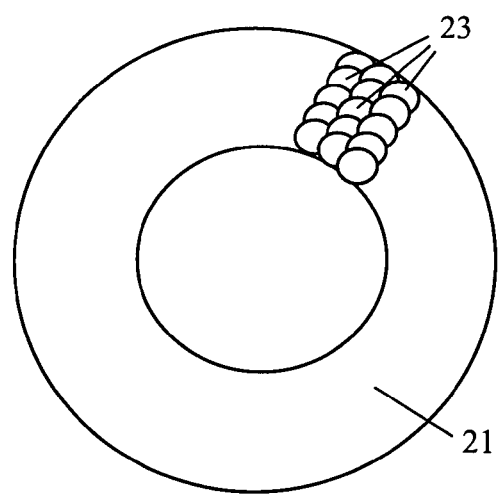
Fig. 4
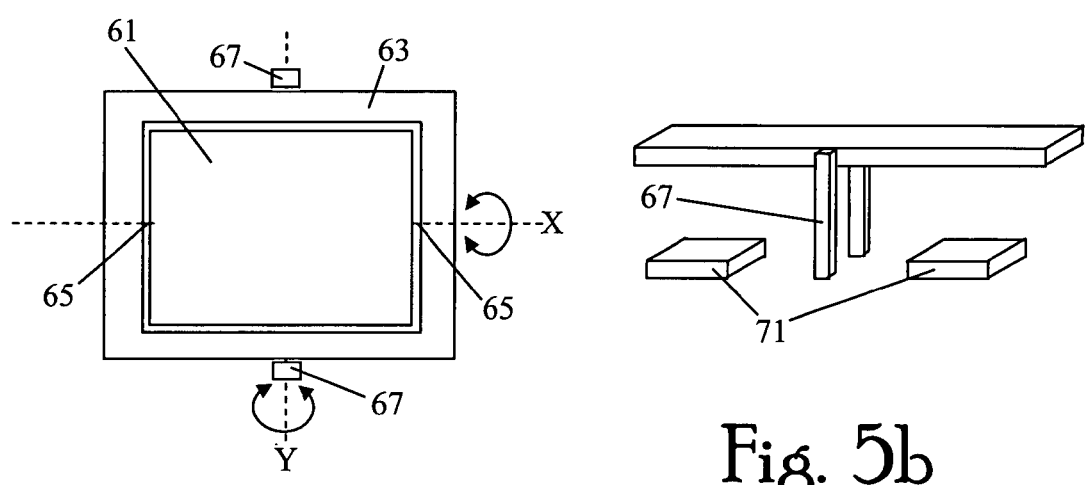
Fig. 5a
Fig. 5b

LITHOGRAPHIC APPARATUS AND METHOD

FIELD

The present invention relates to a lithographic apparatus and method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

U.S. Pat. No. 6,737,662 describes a lithographic apparatus in which an array of mirrors is used to apply a desired angular intensity distribution to a beam of radiation, the beam of radiation subsequently being used to project a pattern onto a target portion of a substrate.

It is desirable, for example, to provide a lithographic apparatus which overcomes or mitigates one or more shortcomings of the apparatus described in U.S. Pat. No. 6,737,662.

SUMMARY

According to an embodiment of the invention, there is provided a method including providing a substrate; providing a beam of radiation using an illumination system; using patterning device to impart the radiation beam with a pattern in its cross-section; and projecting the patterned radiation beam onto a target portion of the substrate; wherein the illumination system includes an array of individually controllable elements and associated optical components arranged to convert the radiation beam into a desired illumination mode; an allocation scheme is used to allocate different individually controllable elements to different parts of the illumination mode; the allocation scheme being selected to provide a desired modification of one or more properties of the illumination mode or of the radiation beam.

According to a further embodiment of the invention there is provided a method including providing a substrate; providing a beam of radiation using an illumination system; using a patterning device to impart the radiation beam with a pattern in its cross-section; and projecting the patterned radiation beam onto a target portion of the substrate; wherein the illumination system includes an array of individually controllable elements and associated optical components arranged to convert the radiation beam into a desired illumination mode; the method further including using the array of individually controllable elements to convert the radiation beam into a first illumination mode, then using the array of individually controllable elements to convert the radiation beam into a second illumination mode; an allocation scheme being used such that individually controllable elements which direct radiation to locations in the first illumination mode are used to direct radiation to locations in the second illumination mode, the locations being selected such that the movement of the individually controllable elements which is required which switching between modes is less than that which would be required if a random allocation scheme were to be used.

According to a still further embodiment of the invention there is provided a method including providing a substrate; providing a beam of radiation using an illumination system; using a patterning device to impart the radiation beam with a pattern in its cross-section; and projecting the patterned radiation beam onto a target portion of the substrate; wherein the illumination system includes an array of individually controllable elements and associated optical components arranged to convert the radiation beam into a desired illumination mode; the method further including using a detector to detect beam pointing variation of the radiation beam, and adjusting the individually controllable elements to at least partially correct for the beam pointing variation.

According to a still further embodiment of the invention there is provided a lithographic apparatus including: an illumination system configured to provide a beam of radiation; a support structure configured to support patterning device, the patterning device serving to impart the radiation beam with a pattern in its cross-section; a substrate table for holding a substrate; and a projection system configured to project the patterned radiation beam onto a target portion of the substrate; wherein the illumination system includes an array of individually controllable elements and associated optical components arranged to convert the radiation beam into a desired illumination mode, the illumination system further including a controller arranged to allocate different individually controllable elements to different parts of the illumination mode according to an allocation scheme, the allocation scheme being selected to provide a desired modification of one or more properties of the illumination mode.

According to an embodiment of the invention, there is provided a device manufacturing method including conditioning a beam of radiation using an illumination system, the conditioning including, controlling an array of individually controllable elements and associated optical components of the illumination system to convert the radiation beam into a desired illumination mode, the controlling including allocating different individually controllable elements to different parts of the illumination mode in accordance with an allocation scheme, the allocation scheme selected to provide a desired modification of one or more properties of the illumination mode, the radiation beam or both; patterning the radiation beam with a pattern in its cross-section to form a patterned beam of radiation; and projecting the patterned radiation beam onto a target portion of a substrate.

According to an embodiment of the invention, there is provided a device manufacturing method including conditioning a beam of radiation using an illumination system, the conditioning including controlling an array of individually controllable elements of the illumination system to convert the radiation beam into a first illumination mode and a second illumination mode in accordance with an allocation scheme such that individually controllable elements which direct radiation to locations in the first illumination mode are used to direct radiation to locations in the second illumination mode, the locations selected such that movement of the individually controllable elements when switching between the first and second illumination modes is less than that with a random allocation scheme; patterning the radiation beam with a pattern in its cross-section to form a patterned radiation beam; and projecting the patterned radiation beam onto a target portion of a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a spatial intensity distribution in a pupil plane;

FIGS. 5a-b schematically illustrates a mirror of a mirror array which may form part of the lithographic apparatus shown in FIG. 1;

DETAILED DESCRIPTION

Figure 1:
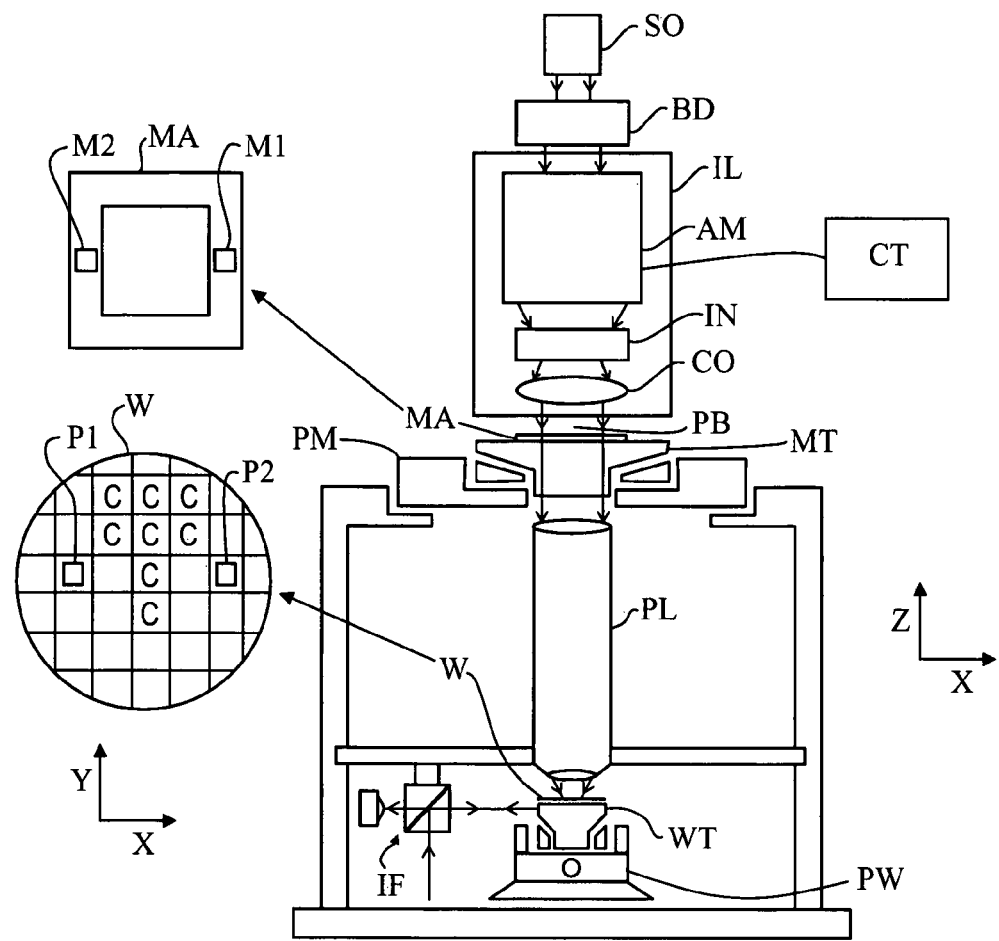
FIG. 1 schematically depicts a lithographic apparatus according to an embodiment of the invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may be of a type which allows rapid switching between two or more masks (or between patterns provided on a controllable patterning device), for example as described in US2007-0013890A1.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

FIG. 1 schematically depicts a lithographic apparatus according to a particular embodiment of the invention. The apparatus includes an illumination system (illuminator) IL to condition a radiation beam PB of radiation (e.g. UV radiation or EUV radiation); a support structure (e.g. a support structure) MT to support a patterning device (e.g. a mask) MA and connected to first positioning device PM to accurately position the patterning device with respect to item PL; a substrate table (e.g. a wafer table) WT configured to hold a substrate (e.g. a resist-coated wafer) W and connected to second positioning device PW to accurately position the substrate with respect to item PL; and a projection system (e.g. a refractive projection lens) PL configured to image a pattern imparted to the radiation beam PB by patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including for example suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL is described further below.

Upon leaving the illuminator IL, the radiation beam PB is incident on the patterning device (e.g. mask) MA, which is held on the support structure MT. Having traversed the patterning device MA, the radiation beam PB passes through the lens PL, which focuses the beam onto a target portion C of the substrate W. With the aid of the second positioning device PW and position sensor IF (e.g. an interferometric device), the substrate table WT can be moved accurately, e.g. so as to position different target portions C in the path of the radiation beam PB. Similarly, the first positioning device PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the radiation beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The illuminator IL may include an adjuster AM configured to adjust the angular intensity distribution of the radiation beam. This may allow adjustment of for example, the outer and/or inner radial extent (commonly referred to as σ-outer and σ-inner, respectively) of the intensity distribution in a pupil plane of the illuminator. In addition, the illuminator IL generally includes various other components, such as an integrator IN and coupling optics CO. The integrator, which may for example be a quartz rod, improves the homogeneity of the radiation beam.

The spatial intensity distribution of the radiation beam at the illuminator pupil plane is converted to an angular intensity distribution before the radiation beam is incident upon the patterning device (e.g. mask) MA. In other words, there is a Fourier relationship between the pupil plane of the illuminator and the patterning device MA (the patterning device is in a field plane). This is because the illuminator pupil plane substantially coincides with the front focal plane of the coupling optics CO, which focus the radiation beam to the patterning device MA.

Control of the spatial intensity distribution at the pupil plane can be used to improve the accuracy with which an image of the patterning device MA is projected onto a substrate W. In particular, spatial intensity distributions with dipole, annular or quadrupole off-axis illumination profiles may be used to enhance the resolution with which the pattern is projected, or to improve other parameters such as sensitivity to projection lens aberrations, exposure latitude and depth of focus.

Figure 2:
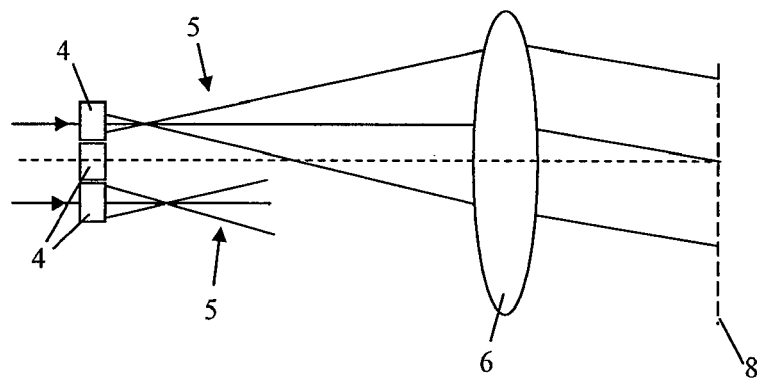
FIG. 2 schematically illustrates the transformation of an angular intensity distribution to a spatial intensity distribution according to a prior art arrangement.

FIG. 2 schematically illustrates the principle of corresponding angular and spatial intensity distributions of a radiation beam PB. According to a prior-art arrangement, the outer and/or inner radial extent of the radiation beam (σ-outer and σ-inner respectively) may be set using an array of diffractive elements 4. Each diffractive element 4 forms a divergent pencil 5 of rays. Each pencil 5 of rays corresponds to a part or sub-beam of the radiation beam PB. The pencils 5 will be incident at a focusing lens 6. In the back focal plane 8 of the focusing lens 6, each pencil 5 corresponds to an illuminated area. The size of the area depends on the range of directions into which the rays of the pencil 5 propagate. If the range of directions is small, the size of the illuminated area in the back focal plane 8 is also small. If the range of directions is large, the size of the illuminated area in the back focal plane 8 is also large. Furthermore, all identical directions of the pencils 5, i.e. all rays which are parallel to each other, correspond to the same particular point in the back focal plane 8 (provided that ideal optical conditions apply).

It is known to produce a spatial intensity distribution in a cross-section of the radiation beam PB (in particular in a pupil plane of the radiation beam) which has an annular shape. This is known as an annular illumination mode. An example of this annular shape is illustrated in FIG. 4 by two concentric circles. The inner radial extent (σ-inner) of the annular shape corresponds to the central area with an intensity of zero or close to zero, and can be set by using an appropriate array of diffractive optical elements. For example, referring to FIG. 2 an array of diffractive elements 4 can be selected which is configured such that none of the pencils 5 of rays will be incident at the central area, and will instead only be incident in the annular area (although in practice, there may be an intensity greater than zero in the central area, due to effects such as dispersion). By appropriate selection of the diffractive element array 4, other spatial intensity distributions can be produced in the cross-sectional area, such as dipole or quadrupole illumination. Additional optical elements (not illustrated) such as a zoom lens or an axicon may be used to apply further modifications to the angular distribution of the radiation beam.

Figure 3:
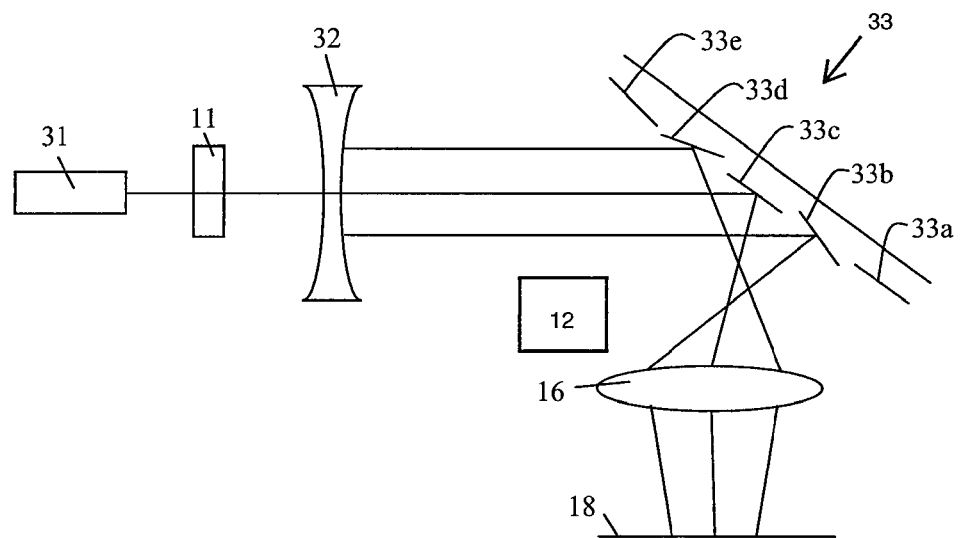
FIG. 3 schematically illustrates in more detail part of the lithographic apparatus shown in FIG. 1.

FIG. 3 schematically shows an alternative prior art arrangement. A source 31 (equivalent to LA in FIG. 1) outputs a relatively narrow, collimated radiation beam which passes through a shutter 11. It is then passed through beam divergence optics 32 which expand the beam to a size which corresponds to the size of an array 33 of reflective elements 33a, 33b, 33c, 33d, 33e. Ideally, the radiation beam divergence optics 32 should output a collimated beam. Preferably, the size of the expanded radiation beam is sufficient that the radiation beam is incident at all reflective elements 33a to 33e. In FIG. 3, by way of example, three sub-beams of the expanded radiation beam are shown.

A first sub-beam is incident at reflective element 33b. Like the other reflective elements 33a, 33c to 33e of the array 33, the reflective element 33b can be controlled to adjust its orientation so that the sub-beam is reflected in a desired predetermined direction. Redirecting optics 16, which may include a focusing lens, redirect the sub-beam so that it is incident at a desired point or small area in a cross-sectional plane 18 of the radiation beam. The cross-sectional plane 18 may coincide with a pupil plane, which acts as a virtual radiation source for other parts of the illuminator (not shown in FIG. 3). The other sub-beams shown in FIG. 3 are reflected by the reflective elements 33c, 33d and redirected by redirecting optics 16 so as to be incident at other points of plane 18. By controlling the orientations of the reflective elements 33a to 33e, almost any spatial intensity distribution in the cross-sectional plane 18 can be produced.

Although FIG. 3 shows only five reflective elements 33a-e, the array 33 may include many more reflective elements, for example arranged in a two-dimensional grid. For example, the array 33 may include 1024 (e.g. 32×32) mirrors, or 4096 (e.g. 64×64) mirrors, or any other suitable number of mirrors. More than one array of mirrors may be used. For example a group of four mirror arrays having 32×32 mirrors may be used. In the following text, the term 'array' may mean a single array or a group of mirror arrays.

The orientation of each mirror of the array 33 may be adjusted separately. The orientations of the mirrors may be controlled by a controller CT (see FIG. 1).

FIG. 4 shows a spatial intensity distribution in a pupil plane which may be produced by the illuminator of the lithographic apparatus. FIG. 4 may be understood as a schematic diagram which illustrates the principle of producing a spatial intensity distribution using a plurality of sub-beams. The drawing plane of FIG. 4 coincides with a cross-section of the radiation beam, for example, the cross-sectional plane 18 of FIG. 3. FIG. 4 depicts fifteen circular areas 23 which represent areas with an illumination intensity greater than a threshold value. The intensity distribution shown in FIG. 4 has approximately the shape of a parallelogram. Since the sub-beams of the radiation beam can be directed to any desired place of the cross-sectional area, almost any intensity profile can be produced. However, it is also possible to produce what could be considered to be conventional intensity distributions, e.g. with an annular shape, with a dipole shape, quadrupole shape, etc. In FIG. 4, the area 21 in between the inner and outer circles can be filled with circular areas 23. The σ-outer and σ-inner can be adjusted by directing the sub-beams to the corresponding places between the inner circle and the outer circle.

FIGS. 5a-b show schematically an example of a reflective element, which may for example form part of the array of reflective elements shown schematically in FIG. 3. The array of reflective elements may include for example more than 1000 of such reflective elements, which may for example be arranged in a grid-like formation in a plane which crosses through a radiation beam. The reflective element shown in FIG. 5a-b is viewed from above in FIG. 5a and in a perspective view in FIG. 5b. For ease of illustration some of the detail shown in FIG. 5a is not included in FIG. 5b. The reflective element includes a mirror 61 with a rectangular reflective surface area. In general, the mirror can have any desired shape, for example square, rectangular, circular, hexagonal, etc. The mirror 61 is connected to a support member 63 via a rotational connection 65. The mirror 61 may be rotated with respect to the support member 63, the rotation being around a first axis X (indicated by a dashed line). The support member 63 is rotationally connected to legs 67 which are supported by a substrate (not shown). The support member may be rotated around a second axis Y (indicated by a dashed line). It is therefore possible to orientate the mirror 61 in directions which require a combination of X-axis and Y-axis rotations.

The orientation of the mirror 61 may be controlled using electrostatic actuators 71. The electrostatic actuators 71 include plates to which predetermined charges are applied. The charges attract the mirror 61 via electrostatic attraction, and are varied to adjust the orientation of the mirror. Sensors may be provided to give feedback control of the orientation of the mirror 61. The sensors may for example be optical sensors, or may for example be capacitive feedback sensors. The plates which are used as electrostatic actuators may also act as the capacitive feedback sensors. Although only two electrostatic actuators 71 are shown in FIGS. 5a-b, more than two may be used. Any other suitable form of actuator may be used. For example piezo-electric actuators may be used.

The orientation of the mirror 61 can be adjusted so as to reflect an incident radiation beam into any desired direction of a hemisphere. Further details concerning reflective elements of the type shown in FIG. 6, and of other types, are disclosed in for example U.S. Pat. No. 6,031,946.

Figure 6:
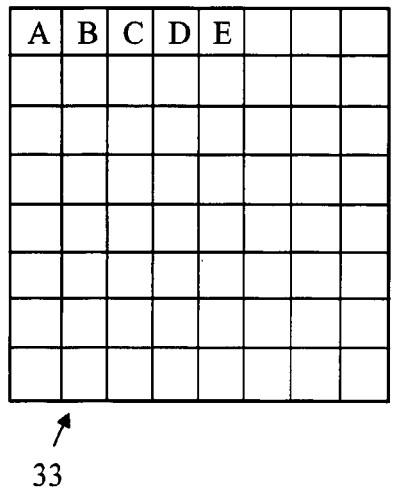
FIG. 6 to 8, 10 and 11 illustrate mirror allocation schemes according to embodiments of the invention.
Figure 6:
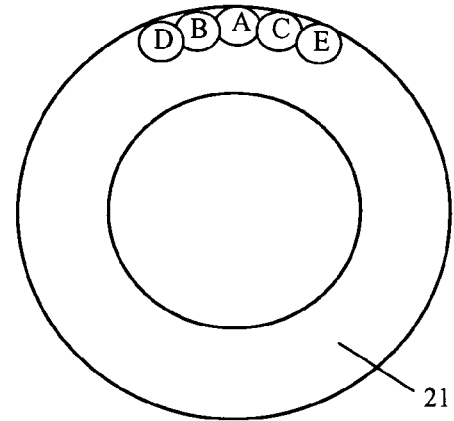

The allocation of mirrors of the array 33 could be done in using a simple approach. For example, FIG. 6 shows schematically an array of mirrors 33, and an annular shape 21 which is formed via appropriate direction of radiation by the mirrors. In a typical simple prior art mirror allocation scheme, a first mirror A is used to direct radiation to an uppermost region of the annular shape. The radiation directed to its location is shown as a circular area A. The second mirror B of the array is used to direct radiation to an adjacent location B of the annular shape. The third mirror C of the array is used to direct radiation to another adjacent location C, etc. As can be seen, the mirror allocation scheme is very simple. It will be appreciated that FIG. 6 is schematic. In practice many more mirrors will be used. There may be more overlap between adjacent illuminated areas. The illuminated areas may be smaller.

In embodiments of the invention, described below, instead of merely allocating the mirrors in a manner such as described above in relation to FIG. 6, the allocation of the mirrors is arranged such that it provides beneficial effects. These may include, for example, compensation for unwanted properties of the lithographic apparatus, adjustment of properties of the radiation beam to improve lithography, etc.

Figure 7:
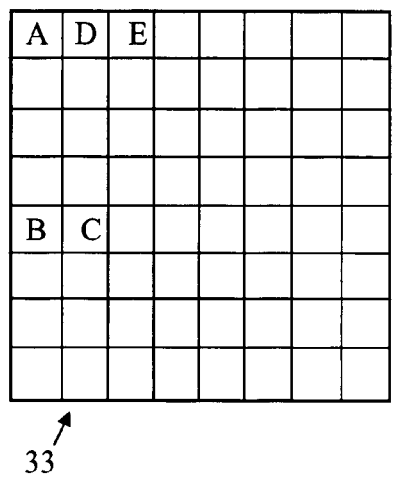
Figure 7:
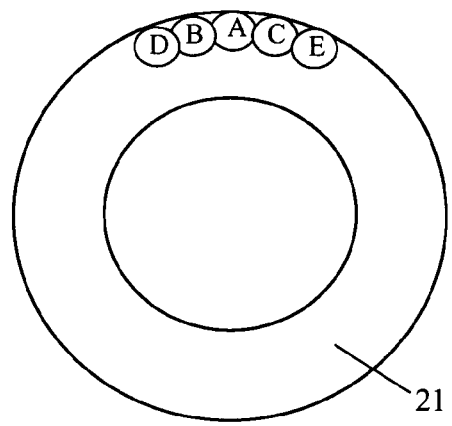

Referring to FIG. 7, a mirror allocation scheme which may be used to improve the uniformity of intensity of radiation in an annular shape 21 is shown. In FIG. 7, different parts of the mirror array 33 are used when forming a given portion of the annular shape. In this example, a first circular area A is formed using a first mirror A which is at the top left hand corner of the array 33 (as viewed in FIG. 6). An adjacent circular area B of the annular shape is formed using a mirror D which is located in the bottom half of the mirror array 33. A different adjacent circular area C is formed using a mirror which is also located in the bottom half of the mirror array. Adjacent circular areas D, E are formed using mirrors which are located in the top half of the array. In this manner, circular areas used to form the annular shape 21 are selected from the top and bottom halves of the mirror array 33. Combining radiation from different parts of the mirror array 33 in this manner may help to reduce variations of the intensity of the radiation which constitutes the annular shape 21.

It is sometimes the case that the reflectivity of mirrors forming a mirror array is not uniform. For example, mirrors at the top of the array may have a higher reflectivity than mirrors at the bottom of the array. This may for example occur due to variations in the materials used to form coatings of the mirrors. Typically, the variation in reflectivity of the mirrors has a low spatial frequency, i.e. the reflectivity does not vary significantly between adjacent mirrors, but instead changes gradually across the surface of the array.

In addition to (or instead of) mirror reflectivity variation, variation of the intensity of the radiation beam across its cross-section may also be seen.

In a situation in which the reflectivity of the array (or the intensity of the radiation beam) gradually increases from top to bottom of the array (as viewed in FIG. 7), then allocation of the mirrors in the manner shown in FIG. 6 will result in a corresponding variation of intensity of radiation in the annular shape 21 formed using the mirrors. That is to say the intensity of the annular shape will gradually increase from the top to the bottom (as viewed in FIG. 7). However, if the mirror allocation scheme shown in FIG. 7 is used, this variation of the intensity is not seen since it has been averaged out by the mirror allocation scheme.

The mirror allocation scheme shown in FIG. 7 is a simple example of a mirror allocation scheme which may be used in an embodiment of the invention to remove or reduce intensity variation in a shape formed using the mirrors. Other mirror allocation schemes may be used for the same purpose.

In an alternative embodiment of the invention, the mirror array may for example be considered as four regions, or eight regions, etc. each region providing some radiation to each portion of a shape formed using the mirrors. This may for example remove or reduce intensity variation which for example could arise from a gradual increase of the reflectivity of the mirrors from left to right as viewed in FIG. 7, or from the top left hand corner to the bottom right hand corner as viewed in FIG. 7.

In general, mirrors may be allocated from different parts of the array in order to reduce intensity variation or to reduce or mitigate some other effect. The sizes of the parts, and their separation, will in general depend upon the spatial frequency (or some other property) of the effect which is to be reduced or mitigated. References in this text to different parts of the array should therefore not be interpreted as being limited to different halves of the array, different quarters of the array, etc. In general references to mirrors in different parts of the array maybe interpreted as meaning that the mirrors do not lie next to one another.

In a further alternative embodiment, the allocation of mirrors may be done randomly. In other words, any mirror of the array 33 may be used to form the first circular area A, and any other mirror may be used to form the second circular area B. Any not used mirror may then be used to form a circular area C, and so on. The mirrors are selected randomly. Random mirror allocation may reduce or remove intensity variation due to reflectivity differences between mirrors of the mirror array. Random mirror allocation will also reduce or remove intensity variation which arises from inhomogeneity (of the intensity in cross-section) of the radiation beam generated by the source SO. This is explained further below.

Figure 8:
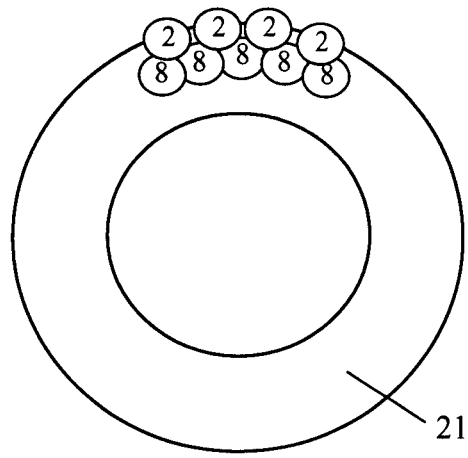

The above-described embodiments of the invention are simplified in the sense that FIG. 6 schematically shows circular areas A-E of radiation falling adjacent to one another with little overlap. However, in some instances the formation of the annular shape (or other shape) may be achieved with an arrangement in which several circular areas are located on top of one another at any given location. A simplified schematic example of this is shown in FIG. 8. Five circular areas located within an annular shape 21 each receive radiation directed by eight different mirrors of the array (the areas are labelled 8). Four circular areas (labelled 2) each receive radiation from two mirrors of the array. A configuration such as this may be used for example where it is desired to taper gradually the intensity of the radiation forming the annular shape. This is a simplified example, and in practice the circular areas may be smaller, and there may be many more overlapping areas, thereby providing a smooth (or smoother) tapering of the intensity. In a situation such as this in which a plurality of circular areas of radiation are located on top of one another, or very close to one another, the mirror allocation scheme used may be based on the schemes described above. Alternatively, the mirror allocation scheme may be different.

In an embodiment of the invention, when determining mirror allocation the reflectivity of the mirrors may be taken into account, when determining which mirrors to use to illuminate particular circular areas. For example, an average mirror reflectivity may be determined. A mirror which has a reflectivity 15% higher than this could be paired with a mirror having a reflectivity 15% less than this. The two mirrors may then be used to illuminate a circular area which is to receive radiation from two mirrors of the array. In this way, the deviation of the reflectivity of the mirrors from the average is accounted for.

A similar approach may be used when determining which mirrors to use to illuminate, for example, a circular area which receives radiation from eight mirrors, or any other circular area which receives radiation from more than one mirror. In some instances, a sensor or other measuring device may be used to measure the reflectivity of each of the mirrors, the measured reflectivities being stored. This would then allow the reflectivity of each individual mirror to be taken into account when determining the mirror allocation. In an alternative arrangement, the reflectivity of individual mirrors is not measured, but rather the reflectivity of portions of the mirror array. Again, this information may be stored and taken into account when determining the mirror allocation.

In an embodiment of the invention, the reflectivity of the mirrors of an array may be used when determining how many mirrors are used to direct radiation to a given location. One manner in which this may be achieved is by, for a given circular area, recording a desired radiation intensity. Each time a mirror is allocated to that location, the radiation intensity delivered by that mirror is subtracted from the desired total. In this way, mirrors continue to be allocated to the desired location until the desired intensity of radiation is provided. Normalization may be used when utilizing this mirror allocation scheme, for example by dividing the total desired power with the number of mirrors, in order to determine the amount of power required per mirror.

Although the above description of embodiments of the invention has referred to using a mirror allocation scheme to compensate for differences in mirror reflectivity, compensation may be provided in the same manner for other imperfections or properties of a lithographic apparatus. For example, mirror allocation may be used to compensate for non-uniformity of the intensity of the radiation beam used to illuminate the array. This compensation may for example be in relation to a property that has previously been measured and which is known or assumed to be constant. Alternatively, the compensation may vary over time, for example based upon periodic measurement of a property of the lithographic apparatus.

In some instances a lithographic apparatus may suffer from a telecentricity offset. When this occurs each of the mirrors of the mirror array 33 may be rotated through a predetermined angle which provides compensation for the telecentricity offset. This rotation of the mirrors is subsequently taken as being the zero or null position of the mirrors. All subsequent rotations of the mirrors in order to form desired radiation beam shapes are applied from a starting point of this zero or null position. The mirrors of the array thereby compensate for the telecentricity offset of the lithographic apparatus.

Some lithographic apparatus suffer from what is known as beam pointing error. The laser (or other source) used to generate the radiation beam generates a beam of radiation, which points in a direction that may vary from time to time. In some prior art lithographic apparatus this is corrected for by providing a so-called steering mirror which corrects the direction of the radiation beam. The steering mirror is controlled by a controller which is configured to detect the pointing error and to determine a suitable orientation for the beam pointing mirror to correct for this. In an embodiment of the invention, mirrors of an array such as the array 33 shown in FIG. 3 may be used to correct for this error, thereby removing the need to provide a steering mirror. The correction may be achieved by using a controller to detect the beam pointing error, and then calculate a suitable angular offset to be applied to the mirrors of the array.

Figure 9:
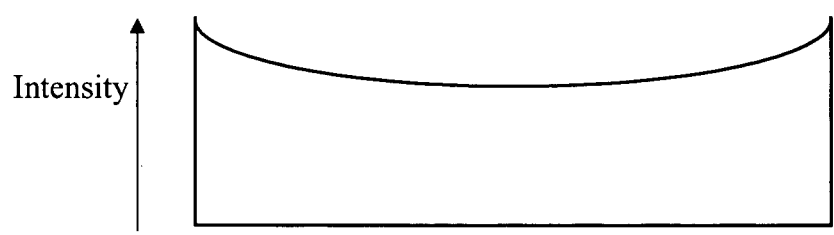
FIG. 9 illustrates the effect of a mirror allocation scheme used to compensate for pupil apodization according to an embodiment of the invention.

In an embodiment of the invention, a mirror allocation scheme may be used to compensate for an effect known as pupil apodization, which sometimes occurs in lithographic apparatus. Pupil apodization means that the transmission of radiation by the projection lens of a lithographic apparatus has an angular dependency. In other words, when considering the radiation beam before it enters the projection system, portions of the radiation beam which are close to the edge of the projection system will be transmitted by the projection system with a lower intensity than portions of the beam which pass through a central region of the projection system. FIG. 9 shows schematically how pupil apodization can be compensated for, using mirrors of an array such as that illustrated in FIG. 3. FIG. 9 shows schematically the intensity of a cross-section of the radiation beam in a pupil plane before it enters the projection system. The array of mirrors has been configured such that more radiation is directed to outer portions of the radiation beam (in the pupil plane) than is directed to a central portion of the radiation beam. The intensity of the radiation beam follows a curve which is selected to compensate for the pupil apodization of the projection system. This may be done for example by using more mirrors to direct radiation to outer portions of the radiation beam (in the pupil plane) than are used to direct radiation to a central portion of the radiation beam (in the pupil plane). The pupil apodization is compensated for by the mirror allocation scheme.

When a coherent source (for example a laser) is used to generate the radiation beam, the coherence of the source may give rise to intensity fluctuations across the cross-section of the radiation beam. This may be thought of as being a form of speckle. The intensity fluctuations in the radiation beam will in general remain static over time. In some instances the intensity fluctuations may cause a deterioration of a pattern projected onto a substrate. In an embodiment of the invention, a mirror allocation scheme may be used to reduce this effect. Where the radiation source is a pulsed source, for example a pulsed laser, this may be done by changing the allocation of mirrors in between radiation pulses, or changing it partway through a series of pulses. This is shown schematically in FIG. 10.

Figure 10:
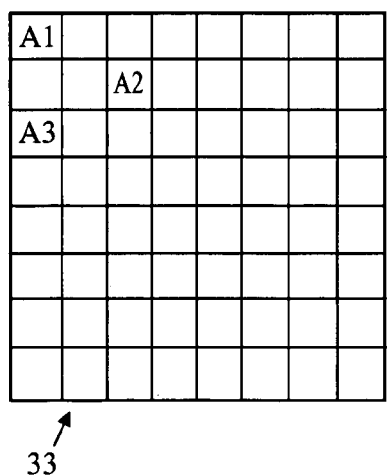
Figure 10:
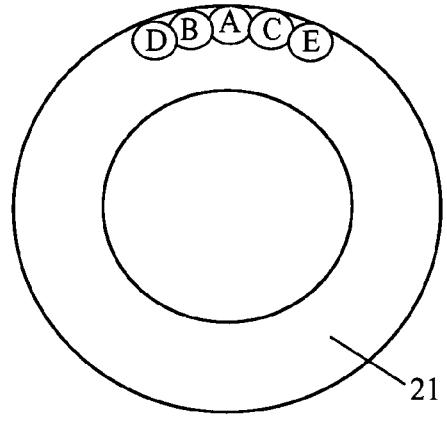

In the example shown in FIG. 10, three pulses of radiation are needed in order to deliver sufficient radiation intensity to a circular area A. The mirror array 33 is configured such that a first mirror A1 is used to deliver the first pulse of radiation. A different mirror A2 is used to deliver the second pulse of radiation. A third mirror A3 is used to deliver the third and final pulse of radiation. Since radiation directed to the circular area A is taken from different regions of the cross-section of the radiation beam, any intensity variations present in the beam will be averaged out or significantly reduced. The selection of the mirrors A1-A3 may be random, may be based upon the spatial frequency of the intensity variation, and/or may take into account the required range of movement of the mirrors between intensity pulses.

If it is desired to deliver a radiation beam with high intensity, then in most instances it will be desired to use most if not all of the mirrors of the array for each radiation pulse. The radiation pulses may be closely spaced in time. This may mean that a given mirror which is used to illuminate a circular area at one location in the annular shape (or other shape) may not have sufficient time to rotate such that for a subsequent pulse it may be used to illuminate a circular area on an opposite side of the annular shape. For this reason, a mirror allocation scheme may be selected in which a given mirror is never required to rotate through more than a small predetermined range of angles between radiation pulses. In other words, the mirror may be used to direct radiation to circular areas which all fall within the same portion of the annular (or other) shape.

In general it may be the case that the mirrors of the array 33 have a limited lifespan. The lifespan may depend in part upon a combination of the number of times that the mirrors are rotated, and the size of those rotations. In an embodiment of the invention a mirror allocation scheme is used to reduce the average size of the angles through which the mirrors rotate.

Figure 11:
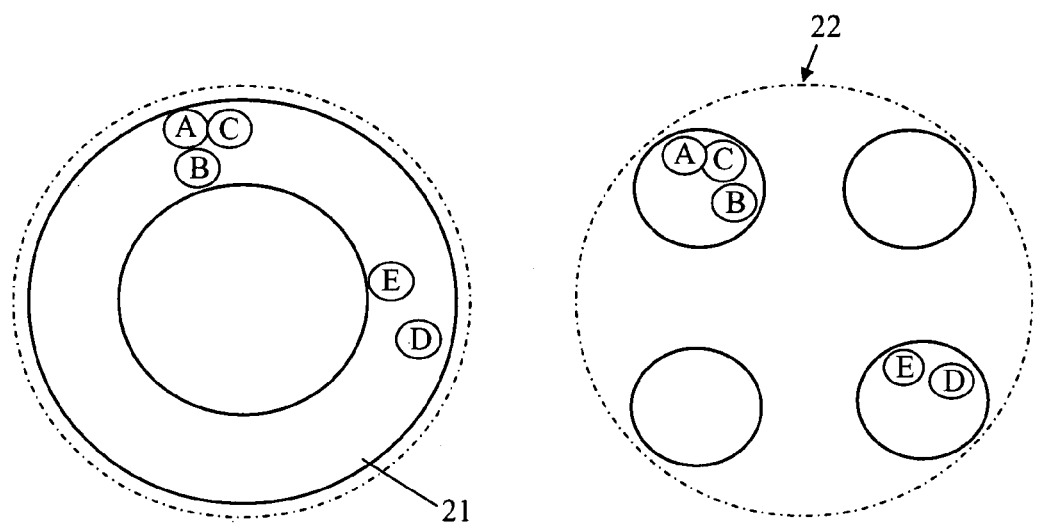

In some instances it may be desired to alternate between two illumination modes, for example a mode which has an annular shape and a mode which has a quadrupole shape. This is shown schematically in FIG. 11. To assist comparison between the modes, a dotted line 22 indicates sigma=1. In an embodiment of the invention, a mirror allocation scheme may be selected such that mirrors which are used to illuminate a given portion of the annular shape are used to illuminate a portion of quadrupole shape which is located in the same general area. In FIG. 11, three circular areas A-C are illuminated in the upper left hand portion of the annular shape. The mirrors which are used to illuminate these circular areas are used to illuminate the quadrupole portion which is closest to that region of the annular shape, i.e. the top left hand portion of the quadrupole. Similarly, circular areas D, E are illuminated with radiation directed to them by particular mirrors. These same mirrors are used to direct radiation to portions of the quadrupole shape which is closest to the relevant portion of the annular shape (i.e. the bottom right hand corner). The mirror allocation scheme takes into account the positions of the mirrors used to illuminate given portions of the annular shape when determining which mirrors to use to illuminate portions of the quadrupole shape located in the same general position. Doing this reduces the angles through which the mirrors are required to rotate, and may thereby prolong the lives of the mirrors. Although the embodiment of the invention refers to switching between an annular mode and a quadrupole mode, the embodiment of the invention may be applied to switching between any modes.

In some instances it may be perceived that the number of mirrors need to be provided in the array 33 is too large. For example, this may be because the cost of providing the mirrors may increase significantly as the number of mirrors in the array rises. The numbers of mirrors required in the mirror array is dependent upon the resolution with which it is desired to form the illumination mode. In other words, if it is desired to form an annular shape which has a very smooth circular curvature at its outer edge then more mirrors will be need than if it is deemed accepted to have some unevenness along the edge of the annular shape.

In an embodiment of the invention, the number of mirrors needed in order to obtain an annular shape (or other shape) with a given resolution may be reduced by moving the mirrors between pulses of radiation (or between series of pulses of radiation). For example, if an exposure of a given location on a substrate needs four pulses of radiation, then the effective number of mirrors may be increased by a factor of four by moving the mirrors between each pulse. In other words, a given mirror may be used to illuminate four different locations (one for each pulse) instead of only illuminating one location. This allows a resolution to be achieved which is equivalent to that provided by four times as many mirrors. In an alternative example, the mirrors may be moved between the second and third pulses, such that the number of mirrors is effectively doubled instead of being increased by a factor of four. In a further example, the number of pulses may be fifty, and the mirrors may be moved after every ten pulses, thereby providing a resolution which is equivalent to increasing the number of mirrors in the array by a factor of five.

In known lithographic apparatus, it is known to use an illumination mode which has a sigma greater than one. This may allow radiation of the first or higher diffraction order to be used to illuminate the patterning device (e.g. mask) MA. A sigma greater than one may be achieved via appropriate orientation of the mirrors of the array 33.

In an embodiment of the invention, one or more mirror allocation schemes may be used to manipulate parameters of the radiation beam, such as for example (in the pupil plane) ellipticity, pole balance and energetic telecentricity through the field. Ellipticity or telecentricity manipulation may be considered to be examples of energy imbalance manipulation.

Figure 12:
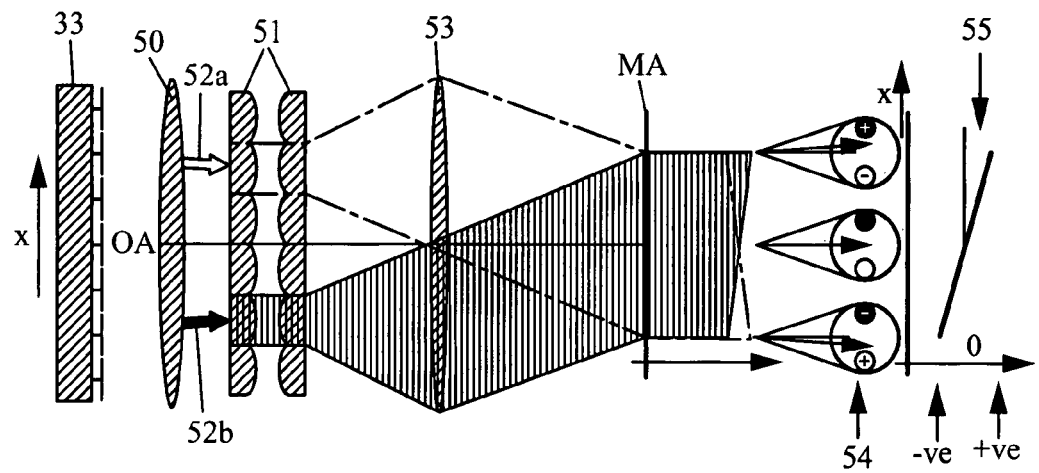
FIG. 12 to 14a-b illustrate telecentricity and mode intensity adjustment using mirror allocation schemes according to an embodiment of the invention.

FIG. 12 shows schematically how a lithographic apparatus may cause a telecentricity error to arise in radiation directed at a mask (or other patterning device) MA. This telecentricity error may be detrimental in that it may degrade a pattern projected onto a substrate by the lithographic apparatus. An embodiment of the invention may use the array of mirrors 33 to correct for this telecentricity error. This could be described as modification of one or more properties of the radiation beam rather than modification of one or more properties of the illumination mode.

In general, embodiments of the invention may be described as using a mirror allocation scheme to provide a desired modification of one or more properties of the illumination mode or of the radiation beam. The term 'modification' refers to a comparison of the illumination mode or radiation beam before it is incident on the array of mirrors and the illumination mode or radiation beam after it has been reflected by the array of mirrors. Although embodiments of the invention are described using mirror arrays, other forms of arrays of individually controllable elements may be used.

Referring to FIG. 12, a radiation beam is reflected by a mirror array 33, via a condensing lens 50, towards a field defining element 51. FIG. 12 is schematic, and it will be appreciated that in practice there may be significant separation between the mirror array 33, condensing lens 50 and field defining element 51. The condensing lens 50 may include a series of lenses.

Mirrors of the mirror array 33 are arranged such that the radiation beam is separated into two regions which are spaced apart from one another (i.e. a dipole mode) at the condensing lens 50. Each region of the radiation beam is directed from the condensing lens 50 towards the field defining element 51. The radiation beam regions 52a, 52b on leaving the condensing lens are angled towards the optical axis OA.

The radiation beam regions 52a, 52b pass through a group of lenses 53 (represented here as a single lens), which focus the radiation beam onto a patterning device (e.g. mask) MA. The patterning device (e.g. mask) MA is located in the exit focal plane of the group of lenses 53. The patterning device (e.g. mask) MA is thus illuminated by a radiation beam which includes two regions 52a, 52b with different angular distributions (a dipole mode).

The total intensity of the radiation at the patterning device (e.g. mask) MA is constant across the surface of the patterning device (e.g. mask). However, the proportions of the first region of the radiation beam 52a and the second region of the radiation beam 52b vary across the patterning device (e.g. mask). For example, at the top of the patterning device (e.g. mask) (as viewed in FIG. 12) the proportion of the first region of the radiation beam 52a is less than the proportion of the second region of the radiation beam 52b. This difference arises because the radiation incident upon the field defining element 51 is not parallel to the optical axis. At the bottom of the patterning device (e.g. mask) MA the proportion of radiation from the first region of the radiation beam 52a is greater than that from the second region of the radiation beam 52b. Again, this arises because the radiation incident upon the field defining elements 51 is not parallel to the optical axis. At the middle of the patterning device (e.g. mask) MA the proportions of radiation from the first and second regions of the radiation beam 52a, b are equal.

Another way of expressing the variation of the radiation across the mask is to say that the telecentricity of the radiation varies. In FIG. 12, the x-direction has been indicated and can be used to help describe the telecentricity variation. At small values of x (at the bottom of the figure) the telecentricity is negative, as indicated by a graph 55. The telecentricity increases, and passes through a zero value at the center of the patterning device (e.g. mask). As the value of x increases, the telecentricity becomes increasingly positive. As shown in the graph 55, the variation of the telecentricity is linear across the patterning device (e.g. mask).

The telecentricity is also represented in schematic drawings 54 which show the equivalent pupil plane at difference locations across the mask. In these illustrations a '+' indicates that more than 50% of the radiation is from a particular pole of the radiation beam, and a '−' indicates that less than 50% of the radiation is from a particular pole of the radiation beam. At small values of x (at the bottom of the figure) the majority of the radiation is from the first region of the radiation beam 52a, and the minority of the radiation is form the second region of the radiation beam 52b. At the top of the patterning device (e.g. mask) the majority of the radiation is from the second region of the radiation beam 52b, and the minority of the radiation is form the first region of the radiation beam 52a. At the center of the patterning device (e.g. mask), equal amounts of radiation are received from the first and second regions of the radiation beam 52a,b.

In an embodiment of the invention, a mirror allocation scheme at the mirror array 33 may be used to adjust the telecentricity of the radiation (for example in a lithographic apparatus). For example, a mirror allocation scheme may be used to remove or reduce from the radiation beam the telecentricity error shown in FIG. 12. For example, a mirror allocation scheme may be used which provides equal proportions of the first and second regions of the radiation beam 52a, 52b on the patterning device (e.g. mask) MA for all values of x (in conventional lithography apparatus the telecentricity error does not arise in the y-direction).

Figure 13:
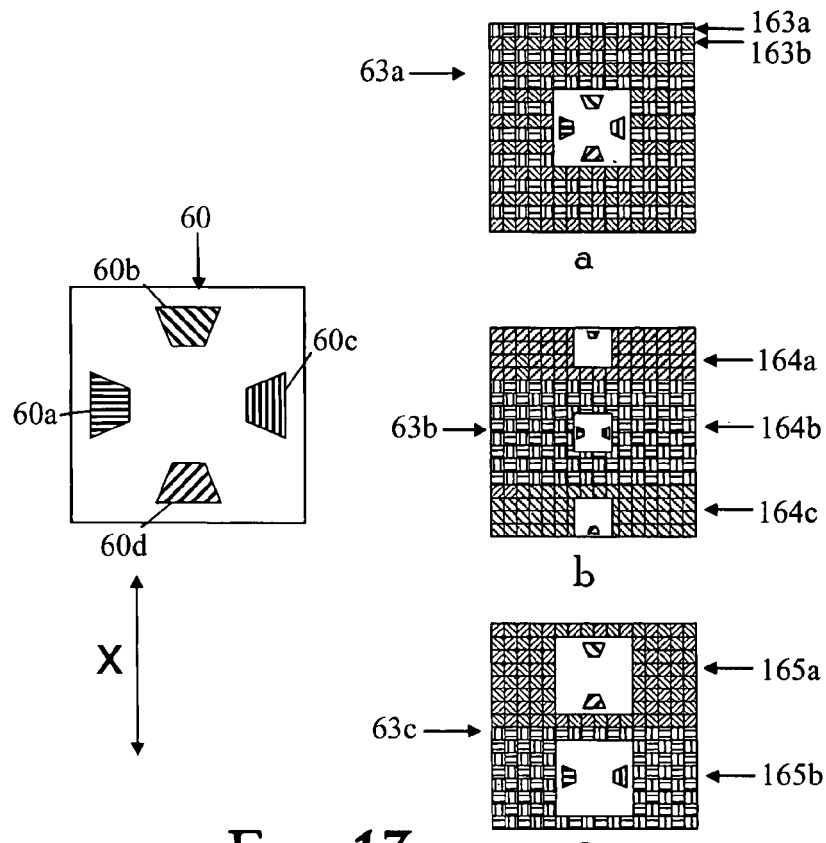

The effect of mirror allocation upon telecentricity is described in relation to FIG. 13.

FIG. 13 shows schematically the mirror array 63a,b,c in three different configurations, each of which is used to generate a so called C-quadrupole illumination mode 60. The C-quadrupole mode includes (in the pupil plane) four beam regions each spaced apart from one another.

The mirror array 63a,b,c includes approximately 1000 mirrors. Each mirror is given a shading which indicates to which mode the mirror directs radiation. For example, if a mirror is white then this indicates that that mirror directs radiation to the left hand pole 60a of the C-quadrupole. If the mirror is black then this indicates that the mirror directs radiation to the upper pole 60b of the C-quadrupole, etc.

In FIG. 13a, the mirrors are allocated in rows. A first row 163a directs radiation to the left and right hand poles 60a,c of the C-quadrupole, and a second row 163b directs radiation to the upper and lower poles 60b,d of the C-quadrupole. Within each row the allocated mirrors are alternated between poles. This mirror allocation scheme will remove or reduce intensity variations due to mirror reflectivity variation or to inhomogeneity of the radiation beam. However, it will not modify the telecentricity of the radiation beam seen at the patterning device (e.g. mask) MA. Therefore, if the lithographic apparatus introduces a telecentricity error, this mirror allocation scheme will not remove or reduce this error.

In FIG. 13b, the mirrors are allocated such that all of the radiation directed to the uppermost pole 60b of the C-quadrupole comes from an uppermost quarter 164a of the mirror array 63b. All of the radiation incident at the lowermost pole of the C-quadrupole is received from a lowermost quarter 164c of the mirror array. The mirror allocation scheme is arranged such that radiation received at the middle two poles of the quadrupole mode is received equally from all parts of a central portion 164b of the mirror array. This mirror allocation scheme introduces significant telecentricity variation in the x-direction of radiation incident upon the patterning device (e.g. mask) MA. No telecentricity variation in the y-direction is introduced by the mirror allocation scheme.

FIG. 13b illustrates how a variation of telecentricity in the x-direction may be applied to a radiation beam. The magnitude of this variation may be reduced by changing which mirrors are allocated to the upper and lower poles 60b,d. For example, instead of allocating all of the mirrors in the uppermost quarter 164a of the mirror array 63b to the upper pole 60b, 80% of them may be allocated to it. The remaining 20% of the mirrors may be allocated to the lower pole 60d. Similarly, 80% of the mirrors in the lowermost quarter 164c of the mirror array 63b may be allocated to the lower pole 60d, with 20% being allocated to the upper pole 60b. In this way, a reduced telecentricity variation is applied to the radiation beam. The sign of the telecentricity applied by the mirror allocation scheme may be reversed by reversing the mirror allocation scheme.

By adjusting the proportions of mirrors allocated to the upper and lower poles 60b,d, using the scheme shown in FIG. 13b, the variation of telecentricity in the x-direction of the radiation beam may be adjusted as desired. A telecentricity may be applied which is the opposite of an unwanted telecentricity which is applied by other parts of the lithographic apparatus. Where this is done, the telecentricity applied by the mirrors will cancel out (or reduce) the unwanted telecentricity, such that the radiation incident upon the patterning device (e.g. mask) MA has a zero telecentricity for all values of x on the mask (or a reduced telecentricity variation). This may be done for example in an iterative manner by measuring telecentricity at the mask (or at substrate level) using a sensor, and adjusting the mirror allocation scheme, then re-measuring telecentricity, etc.

Referring to FIG. 13c, in an alternative mirror allocation scheme, the upper and lower poles 60b,d of the quadrupole mode receive radiation from an upper half 165a of the mirror array 33c, whereas the left and right hand poles 60a,c receive radiation from a lower half 165b of the mirror array.

This mirror allocation scheme may be used when it is desired to control the proportion of radiation which is directed to the left and right hand poles 60a,c compared with the proportion of radiation which is directed to the upper and lower poles 60b,d. The proportion of radiation which is directed to the upper and lower poles 60b,d may for example be increased by increasing the number of mirrors which allocate radiation to those poles. For example, this may be done by re-allocating a row of mirrors such that instead of directing radiation to the left and right hand poles 60a,c they direct radiation to the upper and lower poles 60b,d. This could be for example the row of mirrors which is adjacent to the upper half 164a of the mirror array 63c. The number of mirrors that are re-allocated may be selected based upon the extent to which it is desired modify the proportion of radiation which is present in the left and right hand poles 60a,c compared with the proportion of radiation which is present in the upper and lower poles 60b,d.

The adjustment described in relation to FIG. 13c may be useful for example if horizontal and vertical lines (i.e. lines which extend in the x and y directions) are to be projected onto a substrate using the lithographic apparatus. It may be the case that in the absence of the adjustment more radiation is delivered to the horizontal lines than the vertical lines, for example due to polarisation of the radiation beam. This may cause the horizontal lines formed on the substrate to be thicker than the vertical lines (or vice versa, depending upon the nature of resist provided on the substrate). Adjustment of the proportions of radiation delivered to the left and right hand poles 60a,c compared with the upper and lower poles 60b,d, may be used to remove or reduce this difference. Adjustment of the mirror allocation may thus be used to reduce intensity (and subsequent thickness) variation between horizontal and vertical lines projected onto the substrate.

Figure 14A:
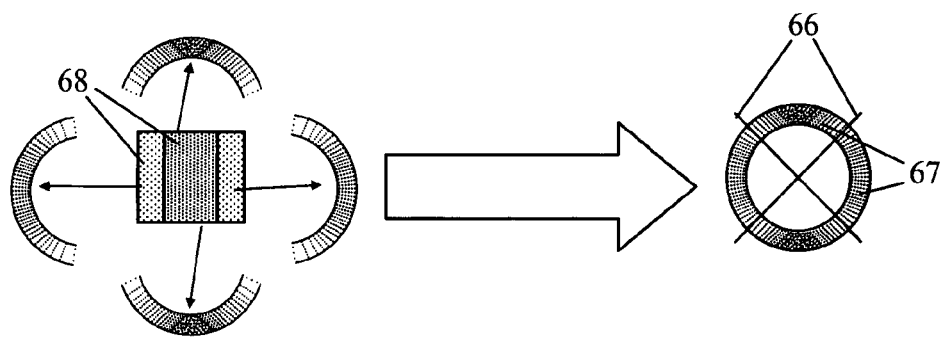
Figure 14B:
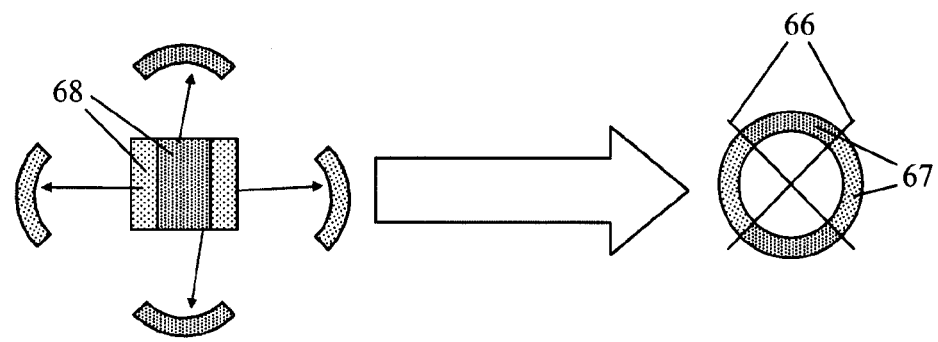

The mirror allocation scheme may be used in the same manner for illumination modes other than a dipole or quadrupole mode. For example, referring to FIG. 14, a mirror allocation scheme which directs radiation from different parts of the mirror array may be used to form an annular illumination mode. Where this is done, boundaries 66 will occur between different parts 67 of the illumination mode which were formed using different parts of the mirror array. If desired, some of the mirrors near to the corresponding boundaries 68 on the mirror array may be allocated to adjacent regions of the illumination mode. Where this is done, the boundaries between different regions of the illumination mode may be smeared out (as shown in FIG. 14a). Where this is not done a 'hard' boundary will be seen between different regions of the illumination mode (as shown in FIG. 14b).

In some instances it may be desirable to have a mirror array which is longer in the x-direction than in the y-direction. This may allow more pronounced modification of properties of the illumination mode, for example telecentricity.

As previously mentioned, a mirror allocation scheme may be modified such that radiation is transferred from one pole to another pole. This may be used to remove or reduce unwanted intensity differences between poles. One or more of the mirrors which directs radiation to a more intense pole may be re-orientated so that it directs radiation to a less intense pole. The number of mirrors that are re-orientated depends upon the difference between the intensities of the poles.

Figure 15:
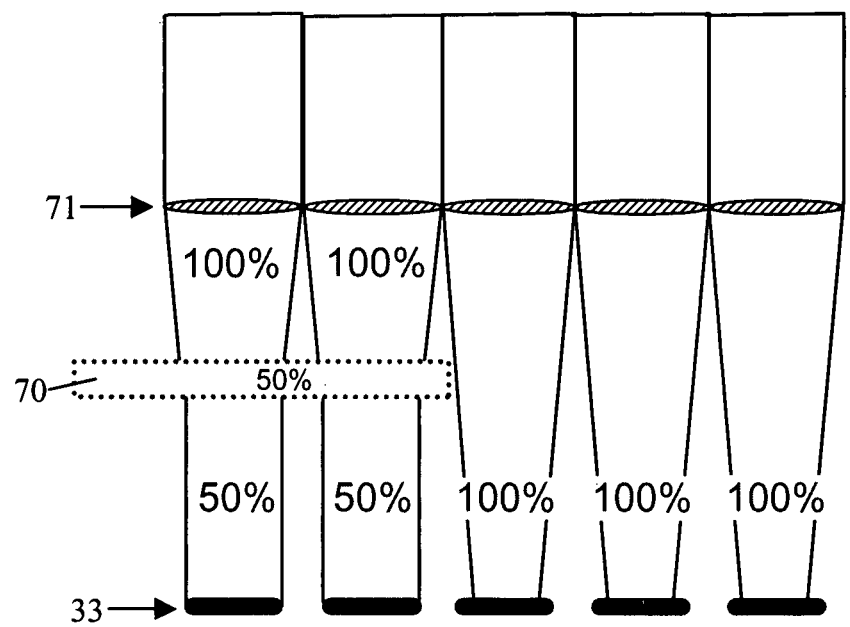
FIGS. 15 and 16 illustrate apparatus used to reduce the amount of radiation incident upon mirrors of the mirror array according to an embodiment of the invention.

In some instances, the measured difference in intensity between poles may be large enough that it is considered to be undesirable, but may be sufficiently small that the diversion of radiation from one pole to the other pole cannot be used to correct for this difference because the amount of radiation reflected by each mirror is greater than the difference between the two poles. Where this is the case, in an embodiment of the invention one or more mirrors may be arranged such that they direct a lesser amount of radiation into the mode. For example, referring to FIG. 15, an attenuator 70 is located between the mirror array 33 and (optional) optics 71 used to focus the radiation beam onto the mirror array. The attenuator 70 may for example attenuate the radiation by 50%, so that two of the mirrors direct radiation with 50% of the normal intensity into the illumination mode. These mirrors may be used to make small adjustments for example to the intensity of a particular pole of a mode, or make other intensity adjustments to other modes.

Although the illustrated attenuator has an attenuation of 50%, attenuators providing other attenuations may be used. Attenuation may be provided for one mirror, two mirrors, or any other number of mirrors. The mirrors may be located adjacent to one another, or may be located at different positions on the mirror array 33.

Figure 16:
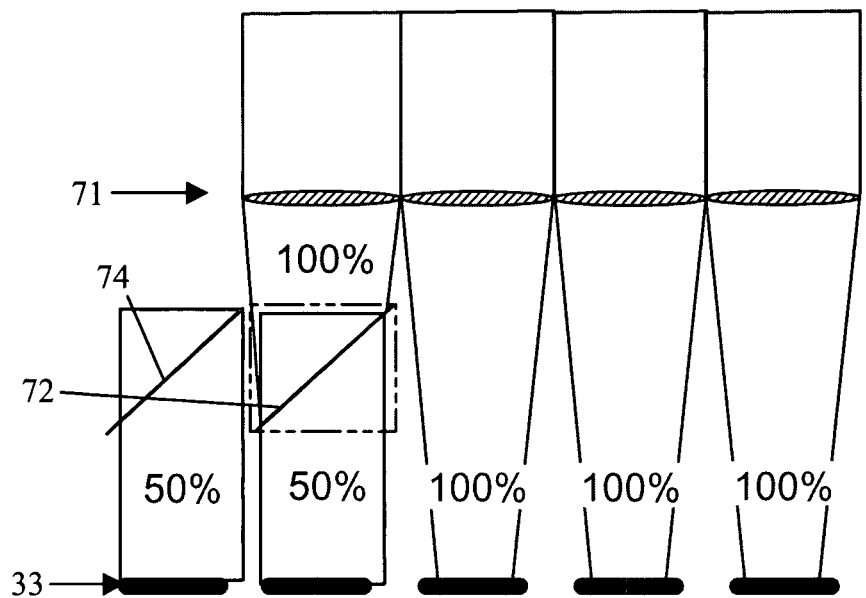

FIG. 16 shows an arrangement in which a beam splitter 72 is used instead of the attenuator 70. The beam splitter 72 is arranged such that incident radiation is received on two mirrors of the mirror array 33 rather than on one mirror. Some of the radiation passes through the beam splitter 72 onto a first mirror. The remaining radiation is reflected by the beam splitter, and is directed by a mirror 74 onto an adjacent mirror. These mirrors may be used to direct radiation with a reduced intensity into an illumination mode. This arrangement does not result in radiation being lost, unlike the arrangement illustrated in FIG. 15. The proportion of radiation directed at each of the mirrors may be modified by changing the reflectivity of the beam splitter.

In a further alternative arrangement (not illustrated) the intensity profile of the radiation beam may be tapered at its edges. Mirrors which receive radiation from edges of the radiation beam therefore receive less radiation than mirrors which receive radiation from the centre of the radiation beam. The mirrors which receive less radiation may be used to provide small adjustments of the intensity of radiation provided to different regions of an illumination mode.

Embodiments of the invention which have been described above in relation to the formation of an annular shape using radiation may be used to form any other suitable shape. In other words, where the description relates to forming an annular illumination mode, this may be replaced by any other suitable illumination mode (for example dipole, quadrupole, etc).

The controller CT shown in FIG. 1 may be arranged to control the orientations of the mirrors of the mirror array, for example to apply a desired mirror allocation scheme to the mirror.

The lithographic apparatus within which embodiments of the invention may be provided may be of a type which allows rapid switching between two or more masks (or between patterns provided on a controllable patterning device). Each mask (or pattern on the patterning device) may need a different illumination mode. The embodiments of the invention are therefore particularly suited to lithographic apparatus of this type, since they allow rapid switching between illumination modes.

Although embodiments of the invention have been described above in relation to a mirror array, any other suitable array of individually controllable elements may be used.

While specific embodiments of the invention have been described above, it will be appreciated that the invention may be practiced otherwise than as described. The description is not intended to limit the invention.

What is claimed is:

1. A method comprising
providing a beam of radiation using an illumination system;
using a patterning device to impart the radiation beam with a pattern in its cross-section; and
projecting the patterned radiation beam onto a target portion of a substrate;
wherein the illumination system comprises an array of individually controllable elements and associated optical components arranged to convert the radiation beam into a desired illumination mode; and
wherein an allocation scheme is used to allocate different individually controllable elements to different parts of the illumination mode, the allocation scheme being selected to provide a desired modification of one or more properties of the illumination mode or of the radiation beam in addition to or other than spatial or angular intensity distribution of the illumination mode.

2. The method of claim 1, wherein the allocation scheme includes using individually controllable elements located in different parts of the array to direct radiation to adjacent locations in the illumination mode.

3. The method of claim 2, wherein the allocation scheme comprises allocating the individually controllable elements randomly.

4. The method of claim 2, wherein the allocation scheme comprises allocating a pair of individually controllable elements to direct radiation to a given location in the illumination mode, each individually controllable element of the pair being located in a different part of the array.

5. The method of claim 1, wherein the allocation scheme includes selecting a number of individually controllable elements which direct radiation to a given location in the mode, the selection being dependent upon the intensity of radiation provided from each individually controllable element.

6. The method of claim 5, wherein the selection is based upon reflectivity of the individually controllable elements.

7. The method of claim 5, wherein the selection is based upon intensity of the radiation beam as incident upon the individually controllable elements.

8. The method of claim 1, wherein the allocation scheme includes allocating more individually controllable elements to direct radiation to outer portions of the radiation beam than are allocated to direct radiation to a central portion of the radiation beam, to reduce the effect of apodization of the radiation beam during projection of the patterned radiation beam onto the substrate.

9. The method of claim 1, wherein the allocation scheme includes sequentially using different individually controllable elements to direct radiation to a given location in the illumination mode, the individually controllable elements being selected from different parts of the array, in order to reduce the effect of intensity variation in the radiation beam.

10. The method of claim 1, wherein the allocation scheme includes using different parts of the array of individually controllable elements to direct radiation to different regions of the illumination mode, the parts of the array being selected so as to apply a desired modification of an energy distribution of the radiation beam.

11. The method of claim 10, wherein the energy distribution modification is a modification of the telecentricity or ellipticity of the radiation beam.

12. The method of claim 10, wherein shapes of the parts are selected to apply the desired modification of the energy distribution of the radiation beam.

13. The method of claim 10, wherein locations of the parts are selected to apply the desired modification of the energy distribution of the radiation beam.

14. The method of claim 1, wherein the allocation scheme includes using different parts of the array of individually controllable elements to direct radiation to different regions of the illumination mode, the parts of the array being selected to direct desired proportions of the radiation beam to different parts of the illumination mode.

15. The method of claim 14, wherein sizes of the parts are modified to modify the proportions of the radiation beam which are directed to different parts of the illumination mode.

16. The method of claim 14, wherein boundaries exist between different areas of the illumination mode, different parts of the illumination mode are formed using different parts of the array of individually controllable elements, and individually controllable elements located near to boundaries of those parts of the array are used to direct radiation to adjacent areas of the illumination mode.

17. The method of claim 14, wherein the allocation scheme takes into account mirrors which direct less radiation than the majority of mirrors, the allocation scheme using one or more of these mirrors to provide fine adjustment of proportions of the radiation beam which are directed to different parts of the illumination mode.

18. The method of claim 1, wherein the individually controllable elements are mirrors.

19. A method comprising
providing a beam of radiation using an illumination system, the illumination system comprising an array of individually controllable elements and associated optical components arranged to convert the radiation beam into a desired illumination mode;
using a patterning device to impart the radiation beam with a pattern in its cross-section;
projecting the patterned radiation beam onto a target portion of a substrate;
using the array of individually controllable elements to convert the radiation beam into a first illumination mode, then using the array of individually controllable elements to convert the radiation beam into a second illumination mode, the array controlled in accordance with an allocation scheme such that individually controllable elements which direct radiation to locations in the first illumination mode are used to direct radiation to locations in the second illumination mode, the locations being selected such that movement of the individually controllable elements which is required when switching between modes is less than that which would be required if a random allocation scheme were to be used.

20. A method comprising:
providing a beam of radiation using an illumination system, the illumination system comprising an array of individually controllable elements and associated optical components arranged to convert the radiation beam into a desired illumination mode;
using a patterning device to impart the radiation beam with a pattern in its cross-section;
projecting the patterned radiation beam onto a target portion of a substrate;
using a detector to detect beam pointing variation of the radiation beam, the beam pointing variation occurring in the radiation beam prior to incidence of the radiation beam on the array of individually controllable elements; and
adjusting the individually controllable elements to at least partially correct for the beam pointing variation.

21. A lithographic apparatus comprising:
an illumination system configured to provide a beam of radiation, the illumination system including
an array of individually controllable elements and associated optical components arranged to convert the radiation beam into a desired illumination mode, and
a controller arranged to allocate different individually controllable elements to different parts of the illumination mode according to an allocation scheme, the allocation scheme being selected to provide a desired modification of one or more properties of the illumination mode or of the radiation beam in addition to or other than spatial or angular intensity distribution of the illumination mode;
a support structure configured to support patterning device, the patterning device serving to impart the radiation beam with a pattern in its cross-section;
a substrate table configured to hold a substrate; and
a projection system for projecting the patterned radiation beam onto a target portion of the substrate.

22. The apparatus of claim 21, further comprising a beam splitter or attenuator arranged to direct a reduced proportion of radiation at an individually controllable element.

23. A device manufacturing method comprising:

conditioning a beam of radiation using an illumination system, the conditioning including, controlling an array of individually controllable elements and associated optical components of the illumination system to convert the radiation beam into a desired illumination mode, the controlling including allocating different individually controllable elements to different parts of the illumination mode in accordance with an allocation scheme, the allocation scheme selected to provide a desired modification of one or more properties of the illumination mode, the radiation beam or both in addition to or other than spatial or angular intensity distribution of the illumination mode;

patterning the radiation beam with a pattern in its cross-section to form a patterned radiation beam; and projecting the patterned radiation beam onto a target portion of a substrate.

24. A device manufacturing method comprising conditioning a beam of radiation using an illumination system, the conditioning including controlling an array of individually controllable elements of the illumination system to convert the radiation beam into a first illumination mode and a second illumination mode in accordance with an allocation scheme such that individually controllable elements which direct radiation to locations in the first illumination mode are used to direct radiation to locations in the second illumination mode, the locations selected such that movement of the individually controllable elements when switching between the first and second illumination modes is less than that with a random allocation scheme;

patterning the radiation beam with a pattern in its cross-section to form a patterned radiation beam; and projecting the patterned radiation beam onto a target portion of a substrate.

* * * * *